(12) United States Patent
Parry et al.

(10) Patent No.: US 6,429,736 B1
(45) Date of Patent: Aug. 6, 2002

(54) ON-LINE CALIBRATION OF LINEAR AMPLIFIERS

(75) Inventors: Ian Stuart Parry, Richmond; Richard Arthur Hillum, Trowbridge, both of (GB)

(73) Assignee: Securicor Wireless Technology Limited, Bath (GB)

( * ) Notice: Subject to any disclaimer, the term of this patent is extended or adjusted under 35 U.S.C. 154(b) by 0 days.

(21) Appl. No.: 09/557,174

(22) Filed: Apr. 21, 2000

(30) Foreign Application Priority Data

Apr. 23, 1999 (GB) ............................................. 9909431

(51) Int. Cl.[7] .............................................. G01R 19/00
(52) U.S. Cl. .............................. 330/2; 330/149; 375/297
(58) Field of Search ...................... 330/2, 149; 375/297

(56) References Cited

U.S. PATENT DOCUMENTS

| | | | |
|---|---|---|---|
| 5,365,190 A | * 11/1994 | Yu et al. | 330/149 |
| 5,623,226 A | * 4/1997 | Whitmarsh et al. | 330/2 |
| 5,880,633 A | * 3/1999 | Leizerovich et al. | 330/84 |
| 6,141,390 A | * 10/2000 | Cova | 330/149 |
| 6,266,517 B1 | * 7/2001 | Fitzpatrick et al. | 455/114 |

FOREIGN PATENT DOCUMENTS

| | | |
|---|---|---|
| EP | 0 598 585 A2 | 11/1993 |
| GB | 2 272 589 | 5/1994 |
| GB | 2 329 085 | 3/1999 |
| WO | 97/30521 | 8/1997 |

* cited by examiner

*Primary Examiner*—Michael B Shingleton
(74) *Attorney, Agent, or Firm*—Nixon & Vanderhye P.C.

(57) ABSTRACT

A cartesian amplifier system for pre-distorting a signal to be amplified to take account of non-linearities and other non-ideal characteristics of the amplifier itself.

A signal to be amplified is divided into quadrature and in-phase signal components in a digital signal processor 1. The processor 1 also pre-distorts the resolved quadrature and in-phase components using various pre-distortion factors. These pre-distortion factors are derived on the basis of a feedback signal from a measurement of the output signal power from the amplifier and on the basis of the signal levels of the pre-distorted resolved components themselves. These pre-distortion factors are constantly updated, thus taking into account any shifts in the non-ideal characteristics of the amplifier.

16 Claims, 4 Drawing Sheets

ON-LINE CALIBRATION OF LINEAR AMPLIFIERS

BACKGROUND OF THE INVENTION

The present invention relates to an amplifier system for continuously calibrating an amplifier. In particular it provides means for continuously calibrating linear radio frequency power amplifiers, typified for example by a Cartesian Loop Amplifier. These types of amplifiers may serve to amplify either a single baseband signal input or a linear combination of baseband inputs occupying different parts of the audio frequency spectrum so as to implement a multi-carrier amplifier.

The need for linear amplifiers arises from the requirements of various government regulatory agencies for operators of radio transmitters to confine all components of the radiated spectrum to within a particular bandwidth, which in modern requirement specifications may be little more than the total bandwidth of the baseband signal. Moreover, designers of such radio transmitters may wish to minimise production costs by employing low cost 'Class C' power amplifier (PA) blocks which are inherently non-linear. In such circumstances, a fair degree of overall amplifier linearity may by achieved by the use of feedback techniques.

The amount of linearising feedback that may be employed in such an amplifier is restricted by the well-established design rules for maintaining the stability of a feedback device under all expected conditions, such as component tolerances and temperature variations. To meet the regulatory type acceptance criteria for very low spurious radiation it is therefore often necessary to apply some auxiliary form of correction to achieve and maintain the best performance.

EP-A-0, 598,585 describes means for carrying out periodic calibration of a Cartesian Loop transmitter of this type. In applications using the present invention an initial calibration may be carried out with the technique described in the aforementioned patent application, or by some other one-off calibration applied during production test, or otherwise, prior to setting the amplifier into service. However, periodic calibration is not suitable for some applications, for example a continuously running data transmission, as it involves interruption of the transmitted signal in order to perform each calibration.

SUMMARY OF THE INVENTION

The present invention therefore is intended to overcome or at least alleviate these problems.

According to one aspect of the present invention, there is provided an amplifier system comprising:

(a) an input for a signal to be amplified;
(b) a power amplifier for amplifying the input signal;
(c) feedback circuitry around the power amplifier;
(d) a signal pre-processor for pre-distorting the input signal prior to supply to the power amplifier in accordance with the value of at least one pre-distortion factor;
(e) a measurement circuit for measuring the output signal power; and
(f) a processor for updating said at least one pre-distortion factor during on-line use of said system on the basis of the pre-distorted input signal and the measured signal power.

According to another aspect of the present invention, there is provided a Cartesian amplifier system comprising:

(a) an input for a signal to be amplified;
(b) a power amplifier for amplifying the input signal;
(c) a Cartesian loop feedback circuitry around the power amplifier having a pair of channels for processing quadrature and in-phase signal components and being arranged to drive the power amplifier with a signal derived from the sum of the quadrature and in-phase signals from the respective outputs of forward paths of those channels;
(d) a signal pre-processor for pre-distorting resolved quadrature and in-phase components of the input signal prior to supply to the channels of the cartesian loop feedback circuitry in accordance with the value of at least one pre-distortion factor;
(e) a measurement circuit for measuring the output signal power; and
(f) a processor for updating said at least one pre-distortion factor constantly during on-line use of said system using the pre-distorted quadrature and in-phase components of the input signal and the measured signal power.

The present invention provides means for continuously identifying, in normal on-line operation, the parameters of a radio frequency amplifier which contribute to its residual distortion products. Additionally the invention provides means for deriving an optimal pre-distortion of the baseband signal in order to minimise the output distortion products of a radio frequency amplifier.

The present invention therefore allows a linear amplifier to be continuously calibrated while on-line, using the actual transmitted signal as a stimulous for providing parameter identification. The adverse effects of out of tolerance parameters are then corrected on-line by means of driving the amplifier with a precisely calculated pre-distorted version of the original baseband signal.

LIST OF FIGURES

Embodiments of the invention will be further described by way of non-limitative example with reference to the accompanying drawings in which.

DETAILED DESCRIPTION OF EMBODIMENTS OF THE INVENTION

Figure 1:
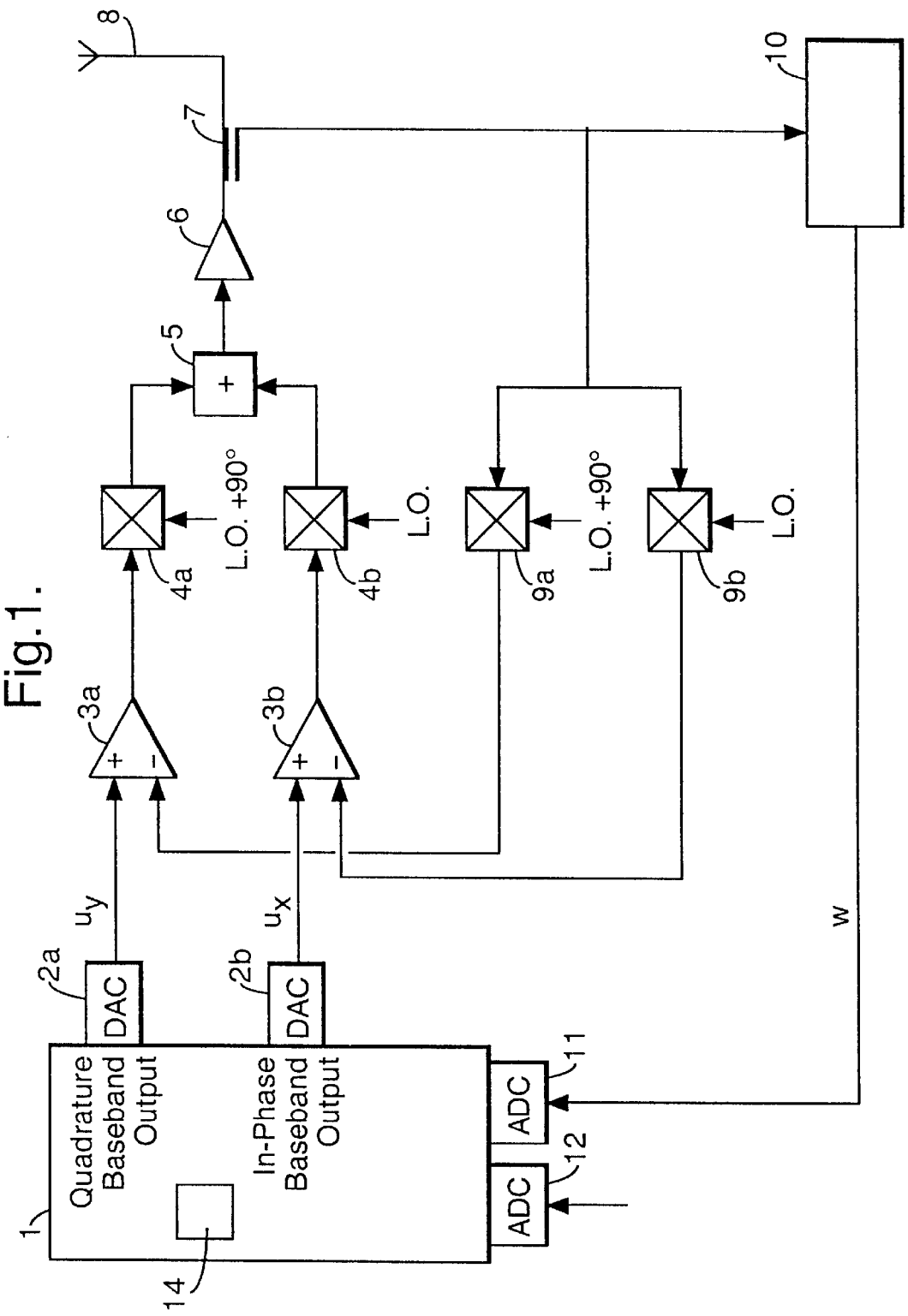
FIG. 1 is an overall block diagram of a Cartesian Loop amplifier systems embodying the present invention.

The configuration of a transmission circuit employing a Cartesian loop amplifier system which embodies the present invention is shown in block form in FIG. 1. An external baseband input signal to be transmitted is applied to the input terminal 12 of digital signal processor (DSP) 1 via an analogue to digital converter. The DSP 1 in normal operation pre-processes the input signal to apply a linearizing pre-distortion to it in a manner described in detail below. The DSP 1 also resolves the input signal into a quadrature baseband output 2a and an in-phase baseband output 2b. The two pre-distorted components are applied in two separate channels, through digital to analogue converters to respective quadrature and in-phase baseband error amplifiers 3a and 3b.

The two error amplifiers 3a and 3b also receive feedback signals as part of their input. The outputs of the error amplifiers 3a and 3b pass through radio frequency-up converter mixers 4a and 4b, with the quadrature mixer 4a fed by a local oscillator signal advanced in phase by 90° with respect to the same local oscillator feed to the in-phase mixer 4b. The outputs of the two mixers are summed by summing circuit 5 and then applied as the drive signal to the input of an RF power amplifier 6. The purpose of the Cartesian loop is to linearize the amplification of an input signal between the input to the DSP 1 and the output of this power amplifier 6.

A directional coupler 7 is used to apply the output of amplifier 6 to an antenna 8 and to obtain a sample of the output which is used to drive the feedback part of the Cartesian loop.

The sampled signal is frequency down-converted backed to baseband by radio frequency down converter mixers 9a and 9b, with the quadrature mixer fed by the local oscillator signal advanced in phase by 90° with respect to the local oscillator fed to the in-phase mixer.

Both frequency up-conversion and frequency down-conversion may be direct from RF to baseband or via one or more stages of intermediate frequency conversion. Moreover frequency up-conversion and frequency down-conversion can occur separately from the phase mixing.

The outputs from the radio frequency down converter mixers 9a, 9b are applied respectively to the feedback inputs of the quadrature and in-phase baseband error amplifiers 3a, 3b.

The sampled output from the directional coupler 7, in addition to being applied to the down-converter mixers 9a, 9b, is fed to a signal strength measurement circuit 10 to derive a signal representing the transmitted RF power. This signal is fed back to the DSP 1 via an analogue to digital converter for use in performing pre-distortion.

FIG. 1 also shows the processed baseband signal components output from the DSP 1 (the in-phase and quadrature components being $u_x$ and $u_y$ respectively) and the power measurement (w) input to the DSP arithmetic unit. These quantities are the instantaneous values prevailing at each of the DSP input/output sampling periods. It is assumed that baseband signals processed and output by the DSP are generated to any required precision. However, the transmitter power output measurement device 10 is assumed to have a small random error with zero mean value; it is also assumed to settle to a measurement of the instantaneous power output within the iteration period of the DSP.

FIG. 1 only shows a schematic configuration. In a practical implementation additional components would be provided to give the Cartesian Loop an adequate phase margin to ensure stability of the feedback circuit. These components are omitted from FIG. 1 for clarity.

The DSP 1 updates the pre-distortion factors used to pre-distort the input signal on the basis of the pre-distorted input signal and the power measured by the circuit 10 constantly during use of the amplifier system in the manner described in detail below. Thus the present invention allow the pre-distortion factors to be updated during normal on-line use of the system, that is with a baseband input signal to be transmitted. Thus the invention avoids the need for a calibration mode where special calibration signals are amplified and transmission is interrupted.

The DSP 1 performs the functions of both a signal pre-processor to pre-distort the input signal and a processor for updating the pre-distortion factors, but these two functions could conveniently be performed by separate elements.

Throughout the following text the convention used is that vectors and matrices are presented in bold type, and all vectors so represented are column vectors. Where a row vector is required it is shown as the transpose of a column vector by use of the superscript T.

The power output of a linear amplifier is simply related to the magnitude of the in-phase and quadrature components ($v_x$ and $v_y$ respectively) of the output of the composite signal emerging from the summing junction 5 and passing together through the PA block 6. After the summing junction 5 and at the output of the PA block 6 these in-phase and quadrature components are not separately observable, but their combination may be measured indirectly through the resulting power output. Measured power output:

$$w = G_m(v_x^2 + v_y^2) \tag{1}$$

where $G_m$ is a scale factor which allows for the characteristics of the measuring device.

For an ideal non-distorting linear amplifier with a voltage gain $G_p$ as measured from the in-phase and quadrature driving outputs of the DSP ($u_x$ and $u_y$ respectively) to the components of the output:

$$v_x = G_p u_x \text{ and } v_y = G_p u_y \tag{2}$$

In vector form, equations (1) and (2) may be expressed respectively as $$w = G_m v^T v \tag{1a}$$

and $$v = G_p u \tag{2a}$$

in which $$u = \begin{bmatrix} u_x \\ u_y \end{bmatrix} \text{ and } v = \begin{bmatrix} v_x \\ v_y \end{bmatrix}$$

Figure 2:
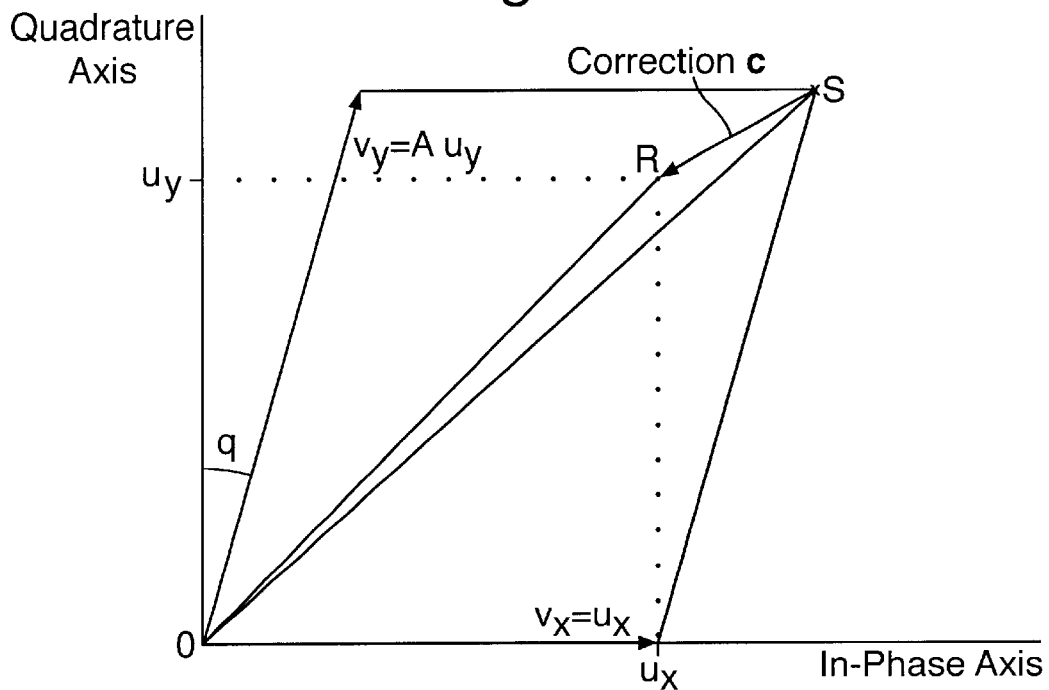
FIG. 2 is a diagram illustrating the main errors in a practical linear amplifier.

However, distortion occurs in a non-ideal, practical amplifier. A model of the main errors arising in a practical radio frequency amplifier is illustrated in FIG. 2 in which the gain of the in-phase path is, for simplicity, shown as unity and having equal inputs, $u_x = u_y$. The quadrature signal path is assumed to have a gain A (where A≈1), and the quadrature axis is assumed to be not exactly orthogonal to the in-phase axis by a small offset angle (q). The vector c in FIG. 2 shows the correction which would need to be added to the actual amplifier output in order to provide an undistorted final result. For an ideal amplifier the power output would be proportional to $(OR)^2$. For a practical amplifier, it is proportional to $(OS)^2$.

However, the provision of such correction at the level of the power output of the amplifier is difficult to achieve, and so this invention employs a novel application of parameter identification coupled with drive level pre-distortion to achieve the same end, as follows.

A more general form of equation (2a) in vector-matrix form, given amplifier voltage gain $G_a$, is:

$$v = G_a M u \tag{2b}$$

in which the matrix M incorporates the error-producing elements (A and q) of an imperfect amplifier. As will now be shown, if the elements of M are identified the DSP 1 can be forced to output a version (u) of the amplifier driving vector pre-distorted by $M^{-1}$ such that for the in-phase and quadrature components of the original baseband signal (s):

$$u=M^{-1}s \quad (3)$$

Substituting u from equation (3) into equation (2b) gives $$v=G_a M M^{-1} s$$

and hence the undistorted output $v=G_a s$ is thereby achieved.

The amplifier distortion matrix M may be considered as comprising two matrices $M_1$ and $M_2$ where $$M=M_1 M_2$$

in which $M_1$ is a stretching matrix to allow for the differential gain (A) in the quadrature axis, and $M_2$ is a rotation matrix to allow for non-orthogonality of the axes.

By inspection, $$M_1 = \begin{bmatrix} 1 & 0 \\ 0 & A \end{bmatrix} \text{ and } M_2 = \begin{bmatrix} 1 & q \\ 0 & 1 \end{bmatrix}$$

Figure 3:
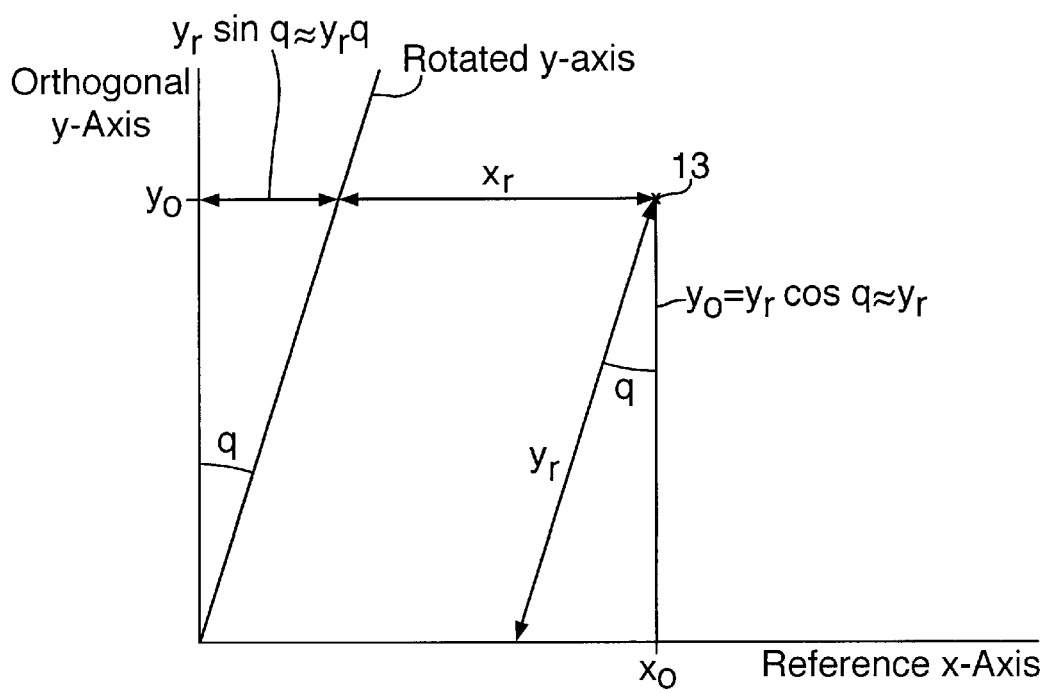
FIG. 3 is a diagram illustrating the co-ordinate transformation for rotation of the Y-axis by angle q.

The value of $M_2$ may be seen from FIG. 3 which illustrates a rotation of the y-axis by an angle q and graphically shows the values of the x and y coordinates of an arbitrary point 13 which has coordinates ($x_o$, $y_o$) relative to the original axes and coordinates ($x_r$, $y_r$) on the rotated axes. From FIG. 3, it is clear that $y_o \approx y_r$ (if q is small) and $x_o = x_r + y_r \sin q$, so $x_o = x_r + y_r q$ (if q is small). These equations give the value of $M_2$ set out above which effects this transformation of coordinates.

$$\text{Hence,} \quad M_1 M_2 = \begin{bmatrix} 1 & 0 \\ 0 & A \end{bmatrix} \begin{bmatrix} 1 & q \\ 0 & 1 \end{bmatrix} \quad (5a)$$

$$\text{and so} \quad M = \begin{bmatrix} 1 & q \\ 0 & A \end{bmatrix}$$

The required predistortion matrix is, $$M^{-1} = A^{-1} \begin{bmatrix} A & -q \\ 0 & 1 \end{bmatrix} \quad (5b)$$

while, for later use, $$M^T = \begin{bmatrix} 1 & 0 \\ q & A \end{bmatrix} \quad (5c)$$

For the identification process, the substitution of v from equation (2b) into equation (1a) gives $$w = G_m G_a^2 [Mu]^T [Mu]$$

Therefore $$w = G_m G_a^2 u^T [M^T M] u \quad (6)$$

and from equations (5a) and (5c):

$$M^T M = \begin{bmatrix} 1 & 0 \\ q & A \end{bmatrix} \begin{bmatrix} 1 & q \\ 0 & A \end{bmatrix}$$

Therefore, ignoring terms in $q^2$, $$M^T M = \begin{bmatrix} 1 & q \\ q & A^2 \end{bmatrix}$$

Hence, equation (6) becomes $$w = B u^T \begin{bmatrix} 1 & q \\ q & A^2 \end{bmatrix} u \quad (7)$$

where in equation (7)

$$B = G_m G_a^2 \quad (8)$$

From equation (8), if the power measurement device 10 has a known and reliable calibration gain $G_m$ (save possibly for a standard error σ) the amplifier gain ($G_a$) may at any time be calculated from a knowledge of the factor B.

The essential on-line identification problem is therefore to determine the parameters A, B and q. These are not directly measured, but must be indirectly estimated. In this invention this task is implemented through the use of equation (7) as follows.

$$\text{Expanding equation (7):} \quad w = B(u_x, u_y) \begin{bmatrix} 1 & q \\ q & A^2 \end{bmatrix} \begin{bmatrix} u_x \\ u_y \end{bmatrix}$$

Therefore $$w = B(u_x^2 + A^2 u_y^2 + 2q u_x u_y) \quad (9)$$

By comparing the form of equation (9) with that of equation (1) it may be noted that distortion products give rise to an additional term in the amplifier power output proportional to ($u_x u_y$). Now, the right hand side of equation (9) may be written as a product of two vectors, thus:

$$w = (u_x^2, u_y^2, u_x u_y) \begin{bmatrix} B \\ BA^2 \\ 2qB \end{bmatrix} \quad (10)$$

With a change of variables, equation (9) may be recognised as being in the following vector form for the $i^{th}$ power measurement:

$$w_i = h_i^T x \quad (11)$$

in which the elements of the measurement vector $h_i$ are defined at the time of the ith measurement by functions of the known outputs of the DSP 1 (that is the pre-distorted quadrature and in-phase components of the input signal), as contained in the row vector of equation (10), and the elements of secondary factor vector x (which are $x_1$, $x_2$, $x_3$) correspond with the elements of the column vector of equation (10) containing the parameters to be identified.

For any number of measurements, which could with advantage be very large, equation (11) may be written in vector matrix form as $$w = Hx \quad (12)$$

where H is a matrix comprising the row vectors ($h_i$) involved in each respective measurement.

When the three elements of x are overdetermined, equation (12) may be solved provided that $|H^TH| \neq 0$ by premultiplying each side of the equation by $H^T$ and rearranging to give $$x = [H^TH]^{-1}H^Tw \qquad (13)$$

However, if there are m measurements the matrix $[H^TH]$ is of size m rows by m columns whose inversion would become a heavy computational load on the DSP arithmetic unit as m increases. To avoid all need for on-line matrix inversion, the following recursive computational procedure is therefore adopted, an explanation of which can be found in "State Variables for Engineers", by P. M. de Russo et al, Wiley 1966.

Whenever a new power measurement ($w_n$) is taken, an update ($x_n$) to the currently estimated value of x based on (n−1) measurements is formed by a combination of the current value and a weighting of the new measurement, thus:

$$x_n = x + k(w_n - h^Tx) \qquad (14)$$

where h is the measurement vector formed from the row elements of H involved in the $n^{th}$ measurement, and k is a vector weighting factor applicable to this measurement. The term in brackets is called a residual and is the difference between the measured signal power and an estimate of the signal power derived from the measurement vector h and the previous value of x. One possibility for the weighting factor k which minimises the error in the estimate of x, in a least squares sense is $$k = Ph(h^TPh+1)^{-1} \qquad (15)$$

In equation (15), P is the covariance matrix of the solution at the $(n-1)^{th}$ measurement and represents the current error in estimation of x. A formal method for calculating the starting value for P is also derived in "State Variables for Engineers" referred to above, but this is usually best determined by simulation and test on the target amplifier.

After a measurement has been incorporated by equations (14) and (15), P is updated for use in the next measurement by $$P_n = P - kh^TP \qquad (16)$$

Initial values of x, k and P are stored in a memory 14 of the DSP 1 and retrieved when the amplifier is turned on. The initial values may be expected values for the amplifier system obtained by theory or experiment. For example the initial value of x may be based on the expected value of the amplifier gain $G_a$ and may take the initial values of A and q as 1 and 0, respectively, which assume as a starting point that there is no distortion.

Alternatively, the initial value of P may be calculated from the first m measurements (where m is the degree of vectors x, h and k) according to the equation:

$$P_{initial} = [H^TH]_m^{-1} \qquad (16a)$$

where the subscript m refers to an m x m matrix involved in the first m measurements.

After any number of measurements, the most recent value of x computed as above may be used to calculate a revised best estimate of the parameters A, B and q, where from equation (10)

$$x_1 = B, x_2 = BA^2 \text{ and } x_3 = 2qB \qquad (17)$$

Hence, $$A = (x_2/x_1)^{0.5}, B = x_1 \text{ and } q = 0.5 x_3/x_1 \qquad (18)$$

and from equations (8) and (18)

$$G_a = (x_1/G_m)^{0.5} \qquad (19)$$

Thus the two parameters A and q required for the elements of the pre-distortion matrix ($M^{-1}$) have been identified, together with the amplifier gain, $G_a$. The input signal can then be pre-distorted accordingly in the DSP 1 as given in equation (3). The parameters could be calculated from the update of x after each measurement, but preferably this is done after a predetermined number of measurements typically greater than 100 and preferably 500.

In a typical application of this invention the baseband signal may, for example, have a bandwidth of 5 kHz or less so that, to meet the Nyquist sampling criterion, the update rate for outputs from the DSP may be in excess of 10,000 samples per second. Any of these samples may be used in conjunction with a coincident power measurement to update x via the recursive relations given by equations (14), (15) and (16). However, as the amplifier parameters are not normally likely to change much in under a few tens of seconds it is only necessary to update the recursive equations, by way of example, for about 1% of the DSP samples in order to have several hundred measurements before updating $M^{-1}$. Moreover, it is desirable not to incorporate new measurements too frequently or at equal intervals of time, but to select samples for measurement based on criteria that:

(a) The DSP drive (u) has components for which the magnitude of the product $|u_x u_y|$ exceeds a predetermined threshold, so as to optimise the effectiveness of the measurement in capturing relatively high magnitudes of the power contained in distortion products. This point is illustrated in the text following equation (9).

(b) The measurements are not too close together in time in order to keep the contributions to the recursive equations linearly independent of each other. This is equivalent to stating that the iteration rate at which measurement samples are used is lower than, and is typically less than 10% of and desirably 1% of, the Nyquist rate for the dominant frequency component of the DSP drive signal, that is the sample data rate of the input digital signal.

In the case where simulation has enabled errors involved in the power measurement device 10 to be characterised by its standard deviation ($\sigma$), which may be a function of the magnitude of the measurement, the gain k in equations (14), (15) and (16) may be replaced, whilst maintaining a least squares estimation, by the Kalman gain (K) based on the principles described in the paper "A new approach to linear filtering and prediction problems" by R E Kalman, Journal of Basic Engineering, March 1960. In this event, equation (15) becomes $$K = Ph(h^TPh + \sigma^2)^{-1} \qquad (20)$$

In the case where the amplifier parameters are slowly changing the techniques described herein may be used to track changes in the parameters and to update the pre-distortion matrix at periodic intervals dependent upon the likely rate of change of the parameters, as determined by simulation and testing of the target amplifier design.

With reference to practical implementation of the identification process, the amplifier radio frequency output power (w) is characterised in the most simple case described herein by equation (9):

$$w = B(u_x^2 + A^2 u_y^2 + 2q u_x u_y) \qquad (9)$$

where the output power is generally at a very much higher frequency than the baseband input signal which has instantaneous components $u_x$ and $u_y$ as generated by the DSP.

By way of example, in a typical mobile radio application the maximum audio frequency contained within the input baseband signal may often be less than 4 kHz, whereas the radio frequency output signal may be often be greater than 200 MHz. This represents a typical frequency ratio of 1:50,000 or more. Hence, if the radio frequency power is measured over a duration of, for example, 100 cycles of the output waveform of the amplifier, the input will only change by 1/500th of a cycle over this duration. Therefore, the sampled values of the inputs $u_x$ and $u_y$ may generally be assumed as constant inputs over the duration of such an output power measurement. Moreover, the duration of the output power measurement should be equally distributed before and after the sampling instant of $u_x$ and $u_y$ to ensure that the measured output power best represents the consequence of the given input, allowing for transmission delay through the amplifier where appropriate.

In an implementation where the assumption of the previous paragraph cannot be reliably held, each side of equation (9) may if necessary be integrated (i.e. by summation of the data samples) over a longer duration of power measurement, provided that the duration of the power measurement is still very much less than the period of the highest frequency component of the baseband waveform. This restriction is necessary because the integral of the product of the orthogonal signals $u_x$ and $u_y$ is zero over any complete number of cycles.

Figure 4:
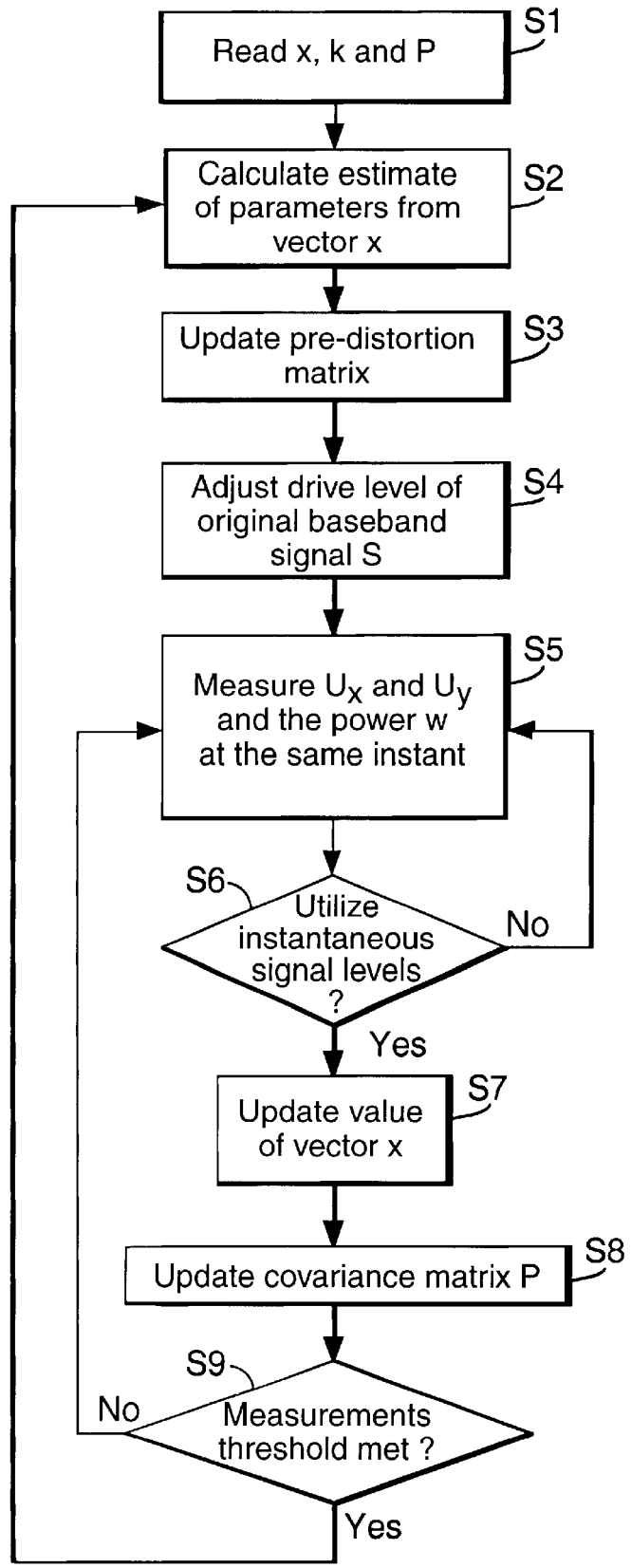
FIG. 4 is a flow chart illustrating an outline of a computational algorithm for updating the basic pre-distortion parameters.

FIG. 4 is a flow chart illustrating an outline of a computational algorithm performed by the DSP 1 to implement the updating of pre-distortion parameters described above. The DSP 1 executes software to implement the algorithm, but could equally be constituted by hardware with appropriate functional elements.

When the amplifier is turned on, in step S1 the initial values for x, k and P are read from the memory 14 of the DSP 1.

Subsequently in step S2 an estimate of the parameters is calculated from the elements of the vector x. For example, the pre-distortion factors A and q and the gain $G_a$ may be calculated from equations (18) and (19).

Subsequently in step S3, the pre-distortion matrix $M^{-1}$ is updated using the parameters calculated in step S2, for example, from equation (5b). The pre-distortion of the input signal s then continues using the up-dated matrix $M^{-1}$ in accordance with equation (3), until $M^{-1}$ is updated again.

Optionally, in step S4 the drive level of the original baseband signal s is adjusted to give the required power outputs of the amplifier system supplied to the antenna 8, depending on the calculated value of the gain $G_a$ of the power amplifier 6.

Subsequently step S5 is performed at a predetermined iteration periodicity which, as described above, gives an iteration rate lower than the sample data rate of the input digital signal s. This may be achieved by waiting in step S5 for an appropriate delay after the previous time step S5 was performed. In step S5, the instantaneous signal levels of the components of the pre-distorted input signal $u_x$ and $u_y$ are taken and the power w at the same instant is measured.

In step S6, which is optional, a decision is made whether to utilise the instantaneous signal levels $u_x$ and $u_y$ and power w. In particular, this is done by determining whether the magnitude of the product $|u_x u_y|$ exceeds a predetermined threshold. Step S6 may also include a test that the measurements are adequately spaced in time, as described above. If it is decided in step S6 not to use the signal levels and power at that instant, then the algorithm reverts back to step S5, but otherwise the algorithm proceeds to step S7.

In step S7, the value of the vector x is updated from the current value to produce a new value $x_n$, for example in accordance with equation (14). To achieve this, initially in step S7 the updated value of the vector waiting factor k is calculated, for example in accordance with equation (15). The algorithm then proceeds to step S8 in which the value of the covariance matrix P is updated for use in the next measurement, for example in accordance with equation (16).

The algorithm then proceeds to step S9 in which the number of measurements taken in step S5 which have been used to update the vector x in step S7 is compared to a predetermined threshold, for example 500 as discussed above. If the number of measurements used in this way falls below the threshold, then the algorithm reverts to step S5 to allow further measurements to be taken and used. However, if the number of measurements used to update the vector x in step S7 has reached the threshold, then the algorithm proceeds to step S2 where the values of the parameters are calculated from the updated value of the vector x.

Figure 5A:
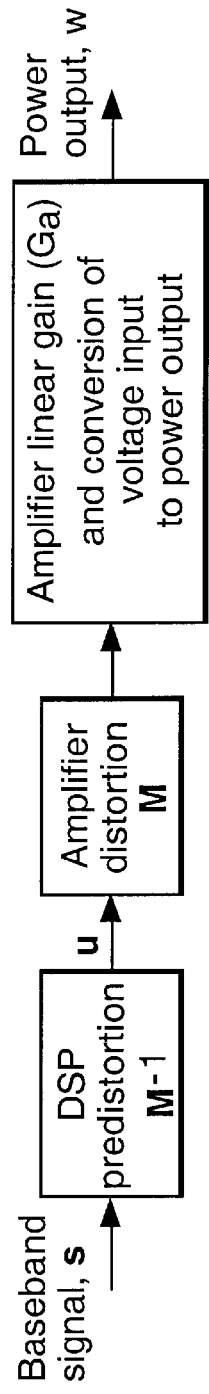
FIG. 5a is a block diagram illustrating the signal flow through the transmitter with pre-distortion allowing only for amplifier distortion.

FIG. 5a shows in block diagram form the signal flows through the amplifier together with the DSP pre-distortion as described above. Clearly, for the case so described, the amplifier distortion M is cancelled by the DSP pre-distortion $M^{-1}$ of baseband input signal s, leaving the wanted linear amplifier gain, $G_a$.

However, in some amplifier implementations an additional problem may arise from 'drift' of the DC operating point of the input error amplifiers (Items 3a and 3b of FIG. 1). This is exhibited by a spurious DC bias input vector $b_a$ which may be nearly compensated for by a DSP correction $-b_c$ that is required to be identified. This case is illustrated in FIG. 5b where the uncompensated residual bias b (having components $b_x$ and $b_y$) is seen to be given by $$b = b_a - b_c$$

Figure 5B:
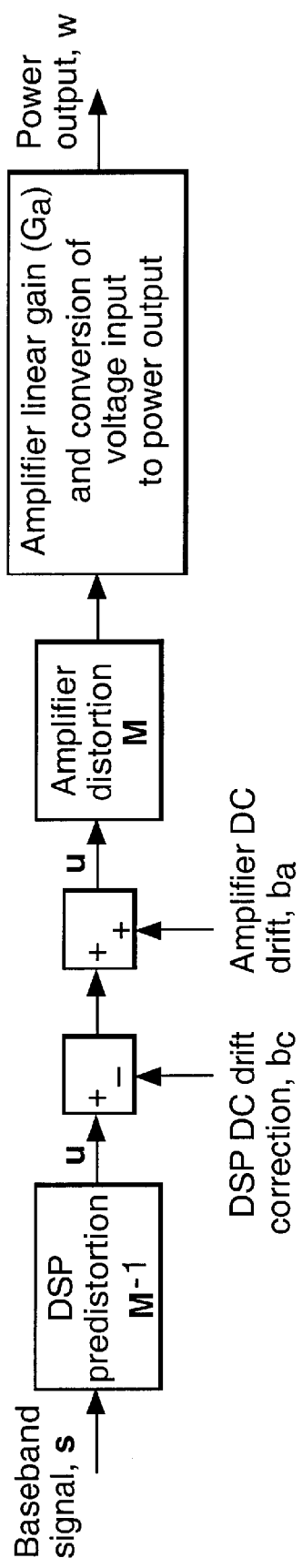
FIG. 5b is a block diagram illustrating the signal flow through the transmitter with pre-distortion allowing for amplifier distortion and DC drift correction.

From FIG. 5b it may also be seen that the total effective drive signal vector U into the amplifier is the sum of the residual bias and the pre-distorted baseband signal u so that $$U = u + b \tag{21}$$

The amplifier parameter identification process now needs to be carried out between the effective drive signal and the resulting power output. This may be done by substituting U for u in equation (10).

$$\text{Hence, } w = [(u_x + b_x)^2 (u_y + b_y)^2 (u_x + b_x)(u_y + b_y)] \begin{bmatrix} B \\ BA^2 \\ 2qB \end{bmatrix} \tag{10a}$$

Expanding equation (10a) and collecting terms gives $$w = [b_x^2 b_y^2 b_x b_y] \begin{bmatrix} B \\ BA^2 \\ 2qB \end{bmatrix} + [u_x^2 u_y^2 u_x u_y u_x u_y] \begin{bmatrix} B \\ BA^2 \\ 2qB \\ 2B(b_x + q \cdot b_y) \\ 2B(A^2 \cdot b_y + q \cdot b_x) \end{bmatrix} \tag{10b}$$

$$\text{So that } w = w_0 + [u_x^2 u_y^2 u_x u_y u_x u_y] \begin{bmatrix} B \\ BA^2 \\ 2qB \\ 2Bb_x \\ 2BA^2 \cdot b_y \end{bmatrix}$$

where in equation (10b) the second order of small quantity terms $qb_y$ and $qb_x$ have been ignored and the term $w_0$ contains only the parameters $b_x$, $b_y$, B, A and q. These are the current best estimate values which are assumed fixed during any period of parameter identification.

It may then be noted that equation (10b) may be recast as $$w = [u_x^2 u_y^2 u_x u_y u_x u_y 1] \begin{bmatrix} B \\ BA^2 \\ 2qB \\ 2Bb_x \\ 2BA^2 \cdot b_y \\ w_0 \end{bmatrix} \quad (10c)$$

Hence, equation (10c) may be written in the form $$w = [u_x^2 u_y^2 u_x u_y u_x u_y 1] \begin{bmatrix} x_1 \\ x_2 \\ x_3 \\ x_4 \\ x_5 \\ x_6 \end{bmatrix} \quad (22)$$

so that, for any given power measurement, equation (22) has the form of equation (11), and the $x_i$ (i=1, 6) may be identified from the on-line signals by similar means. However, the parameter $x_6$ (=$w_0$) simply indicates a fixed part of the power output caused by the residual DC bias and is not further used in the identification process.

By equating elements one to three, respectively, in the column vectors of equations (10c) and (22), the values of B, A, q and $G_a$ are seen to be as defined by equations (17), (18) and (19). The identified values of parameters A and q are then used to update the pre-distortion matrix $M^{-1}$.

Additionally, by equating the fourth and fifth elements of the column vectors, the residual DC bias errors are calculated as:

$$b_x = x_4/2x_1 \quad (23)$$

and $$b_y = x_5/2x_2 \quad (24)$$

These values of $b_x$ and $b_y$ are then used to update the DC bias correction $b_c$ applied by the DSP as shown in FIG. 5b, thereby reducing any residual bias.

A special case arises where a linear amplifier is used to amplify a baseband signal of the type known as Transparent Tone In Band (TTIB), the generation of which is described in GB-A-2,161,661. In this kind of application the baseband signal has an inherent DC component which is required to be preserved through the linear amplifier so as to cause it to output a continuous low level radio signal at the centre of the occupied bandwidth, and known as the 'reference vector' tone. For such case the residual DC input bias is not required to be zero, but instead is required to be set at a level determined by the wanted power output of such tone and the identified gain $G_a$ of the amplifier.

In the most general case where a linear amplifier as described herein is used as a multi-carrier amplifier, the calibration means described heretofore may not always be sufficient to ensure that the residual distortion caused by intermodulation of the individual baseband signals is sufficiently small. This type of distortion may, for example, occur as a result of non-linearity of the mixers comprising Items 4a, 4b, 9a, 9b of FIG. 1.

In comparison with equation (2), a DSP drive input signal s to either the in-phase or quadrature channel may in such circumstances be characterised by an output from the respective channel in terms of a function of the form $$v = G_a(s + g_2 s^2 + g_3 s^3 + \ldots) \quad (25)$$

in which $g_2$ and $g_3$, etc, are gain factors associated with the respective components $s^2$ and $s^3$, etc.

In equation (25) the DSP drive input s to the amplifier represents the total drive signal before this distortion, and at the output it appears that spurious inputs $g_2 s^2$ and $g_3 s^3$, etc, have been introduced. The drive input may therefore be pre-distorted so as to produce a relatively undistorted amplifier output by means of subtraction of these distortion terms from the undistorted input drive, provided that the distortion gain parameters $g_2$ and $g_3$, etc, are identified with sufficient accuracy.

Without loss of generality as to the means hereinafter adopted, it will be assumed for simplicity of description that the main source of intermodulation distortion arises from the cubic term of equation (25), for example, as in a typical amplifier implementation using double-balanced mixers. Hence, equation (25) may be approximated by $$v = G_a(s + g s^3) \quad (26)$$

where in equation (26) the unnecessary subscript on g has been suppressed. Moreover, it is noted that the cubic term normally contributes only a low level of distortion output compared with the level of the fundamental output signal ($G_a s$), so that g<<1. The two steps now to be described are, as previously, first parameter identification and then pre-distortion.

It is observed that the total drive signal (u of equation (2a)) into the amplifier now comprises the terms in brackets on the right hand side of equation (26), so that the elements of the vector u, are:

$$u_x = s_x + g_x s_x^3 \text{ and } u_y = s_y + g_y s_y^3 \quad (27)$$

In equation (27) the subscripted terms $g_x$ and $g_y$ now designate the respective gain factors of the cubic contributions of the drive inputs to the in-phase and quadrature axes, respectively.

Hence, substituting u from equation (27) into equation (9) and expanding gives $$w = B[s_x^2 + A^2 s_y^2 + 2qs_x s_y + (2g_x s_x^4 + 2A^2 g_y s_y^4)] \quad (9a)$$

where in equation (9a) expansion terms involving second order small quantities such as $g_x^2$ and $qg_y$, etc, are neglected. By comparing equation (9a) with equation (9) it is seen that equation (9a) contains two additional terms involving the cubic gain factors.

Following the development of equation (9), equation (9a) may then be written as the product of two 5-dimensional vectors. One of these vectors contains elements which are functions of $s_x$ and $s_y$. The other vector (x) has elements which are combinations of the unknown parameters B, A, q, $g_x$, $g_y$.

The parameter identification process follows as previously described by the use of equations (11) through (15), followed by steps similar to equations (17) through (20). However, starting values for the parameters $g_x$ and $g_y$ also need to be defined for an algorithm similar to that shown in FIG. 4, and if the testing of samples of the target amplifier has not been able to define consistent starting values for them it may be assumed initially that they each have magnitude zero.

At the stages in the computational algorithm when the five unknown parameters have been calculated from a sufficiently large number of output power measurements, the drive signal into the amplifier may be pre-distorted to force a linear output by the following means.

To illustrate the pre-distortion means, the elementary case of a single-input, single-output amplifier is first described, as characterised by equation (26) above. In this case the required linear output ($v_R$) is simply given by $$v_R = G_a s \quad (28)$$

To obtain such output with the transfer function of equation (26) a correction (c) to the actual output (v) is needed, such that $$c = v_R - v \quad (29)$$

Hence, output correction required:

$$c = -G_a g s^3 \quad (30)$$

Therefore, to a first order approximation, ignoring cubic distortion of the distortion component, the input correction is $$c_1 = (G_a)^{-1} c = -g s^3 \quad (31)$$

Thus, the required pre-distorted drive signal (u) is approximated by $$u = s - g s^3 \quad (32)$$

Proof that equation (32) provides the appropriate drive is demonstrated by substituting u from equation (32) in place of s in equation (26).
Thus $$v = G_a[(s - g s^3) + g(s - g s^3)^3] \quad (33)$$

Expanding equation (33):

$$v = G_a[s - g s^3 + g s^3 + \ldots]$$

Hence, ignoring high order distortion terms involving the small quantities $g^2$, $g^3$, etc, $$v = G_a s \text{ as required}$$

Pre-distortion of the in-phase and quadrature drive signals for a Cartesian Loop, or other, linear amplifier follows similarly to the single-input, single-output example just given, except that the signals are now presented in vector form and that the amplifier is also considered to exhibit a calibration distortion characterised by the matrix M. Otherwise, the approach follows the simplified example of the single-input, single-output amplifier, and so the corresponding equations are, by way of comparison, given the same numbering with a letter suffix.

Consider FIG. 2, which shows the correction c required to the amplifier output voltage in order to realise an undistorted output. For true linearity, the unobservable output vector ($v_R$), represented by the line OR, is required to end at point R in the figure, where for an amplifier gain $G_a$ $$v_R = G_a s \quad (28a)$$

in which s in this case is the baseband signal, undistorted by any cubic terms. However, the actual, but unobservable, output vector (v), represented by the line OS, ends at some point S, where $$v = G_a M s + G_a M \begin{bmatrix} g_x & 0 \\ 0 & g_y \end{bmatrix} \begin{bmatrix} (s_x)^3 \\ (s_y)^3 \end{bmatrix} \quad (26a)$$

The required output correction is:

$$c = v_R - v \quad (29a)$$

Substituting for $v_R$ and v into equation (29a) gives, where I is the unit matrix: Output correction required $$c = G_a[I - M]s - G_a M \begin{bmatrix} g_x & 0 \\ 0 & g_y \end{bmatrix} \begin{bmatrix} (s_x)^3 \\ (s_y)^3 \end{bmatrix} \quad (30a)$$

Hence, input correction, $$c_1 = [G_a M]^{-1} G_a [I - M]s - [G_a M]^{-1} G_a M \begin{bmatrix} g_x & 0 \\ 0 & g_y \end{bmatrix} \begin{bmatrix} (s_x)^3 \\ (s_y)^3 \end{bmatrix} \quad (31a)$$

Therefore, $\quad c_1 = [M^{-1} - I]s - \begin{bmatrix} g_x & 0 \\ 0 & g_y \end{bmatrix} \begin{bmatrix} (s_x)^3 \\ (s_y)^3 \end{bmatrix} \quad (31b)$ But predistorted input $$u = c_1 + s \quad (32a)$$

Hence, required drive $$u = M^{-1} s - \begin{bmatrix} g_x & 0 \\ 0 & g_y \end{bmatrix} \begin{bmatrix} (s_x)^3 \\ (s_y)^3 \end{bmatrix} \quad (32b)$$

As may be seen from equation (32b), once the magnitudes of the distortion gain terms, $g_x$ and $g_y$, have been identified the correction to the input drive is a straightforward subtractive process similar to the previously described bias correction. Finally, it may be noted that when $g_x = g_y = 0$ equation (32b) reverts to equation (3).

To those skilled in the art it is clear that the processes herein described may be extended to include the simultaneous identification of: the distortion gain terms ($g_x$ and $g_y$), the residual bias terms ($b_x$ and $b_y$), the amplifier gain ($G_a$) and the elements A and q of the distortion matrix M by means of an 8-dimension vector equation given by the general form of equation (11). The seven identified parameters may then be used as herein described to compensate an imperfect practical amplifier for: the combined effects of the distortions caused by differential gain between the in-phase and quadrature axes and non-orthogonality of the axes, to null (or, for TTIB, to set) any residual DC input bias, and to remove the effects of harmonic distortion such as may be caused by cubic terms (or other non-linear terms) in the transfer function of components of the amplifier such as in the mixer elements.

As will be appreciated by the skilled person, whilst the desired embodiment relates to a Cartesian amplifier system, the techniques employed could equally be applied to other types of amplifier.

What is claimed is:

1. An amplifier system comprising:
   (a) an input for a signal to be amplified;
   (b) a radio frequency power amplifier for amplifying the input signal to produce a radio frequency output signal;
   (c) feedback circuitry around the power amplifier arranged to linearise the amplification of the input signal by the power amplifier, the linearised amplification having some residual distortion;
   (d) a signal pre-processor arranged outside the feedback circuitry around the power amplifier for pre-distorting the input signal prior to supply to the power amplifier in accordance with the value of at least one pre-distortion factor selected to minimise said residual distortion;
   (e) a measurement circuit for measuring the output signal power; and (f) a processor for updating said at least one pre-distortion factor during on-line use of said system using the pre-distorted input signal and the measured output signal power without using frequency down-converted, resolved quadrature and in-phase components of the output signal.

2. A cartesian amplifier system comprising:

(a) an input for a signal to be amplified;

(b) a radio frequency power amplifier for amplifying the input signal to produce a radio frequency output signal;

(c) a cartesian loop feedback circuitry including a feedback path around the power amplifier, the cartesian loop feedback circuitry being arranged to linearise the amplification of the input signal by the power amplifier, the linearised amplification having some residual distortion, the cartesian loop feedback circuitry having a pair of channels for processing quadrature and in-phase signal components, a frequency up-converter for frequency up-converting the quadrature and in-phase signal components in forward paths of the pair of channels from baseband to radio frequency, and a frequency down-converter for frequency down-converting the feedback signal in the feedback path from radio frequency to baseband, and the cartesian loop feedback circuitry being arranged to drive the power amplifier with a signal derived from the sum of the quadrature and in-phase signals from the respective outputs of the forward paths of the pair of channels;

(d) a signal pre-processor for pre-distorting resolved quadrature and in-phase components of the input signal prior to supply to the channels of the cartesian loop feedback circuitry in accordance with the value of at least one pre-distortion factor selected to minimise said residual distortion;

(e) a measurement circuit for measuring the output signal power; and (f) a processor for updating said at least one pre-distortion factor constantly during on-line use of said system using the pre-distorted quadrature and in-phase components of the input signal and the measured output signal power without using frequency down-converted, resolved quadrature and in-phase signal components of the output signal.

3. A system according to claim 2, wherein the at least one pre-distortion factor includes a factor to allow for differential gain between the quadrature and in-phase components of the input signal.

4. A system according to claim 2, wherein the at least one pre-distortion factor includes a factor to allow for non-orthogonality of the quadrature and in-phase axes.

5. A system according to claim 2, further comprising quadrature mixer means and in-phase mixer means, and wherein said at least one pre-distortion factor includes a factor to compensate for non-linearity of said mixer means.

6. A system according to claim 2, wherein the cartesian loop feedback circuitry includes:

respective error amplifiers for said pair of channels for amplifying the difference between (i) the resolved quadrature and in-phase component, respectively, of the input signal from the pre-processor and (ii) respective feedback signals from said feedback path; and means for obtaining resolved quadrature and in-phase components of the output signal as the respective feedback signals to be applied to the inputs of the error amplifiers.

7. A system according to claim 6, wherein said at least one pre-distortion factor includes a factor to pre-distort to allow for a drift of the DC operating points of the error amplifiers.

8. A system according to claim 6, wherein the frequency up-converter is arranged to frequency up-convert the output of the quadrature and in-phase channels of the error amplifiers, and the frequency down-converter is arranged to frequency down-convert the output signal of the power amplifier to baseband prior to said output signal being resolved to said quadrature and in-phase feedback signals.

9. A system according to claim 2, wherein the processor is arranged recursively to calculate a measurement vector, the elements of which are functions of the pre-distorted quadrature and in-phase components, and to use the measurement vector and the measured output signal power to update a secondary factor vector, the elements of which are functions of the at least one pre-distortion factor.

10. A system according to claim 9, wherein the processor is arranged to calculate an updated value of the at least one pre-distortion factor from the secondary factor vector for supply to the signal pre-processor after the secondary factor vector has been updated a predetermined number of times.

11. A system according to claim 10, wherein the predetermined number of times is at least 100.

12. A system according to claim 9, wherein the processor updating is arranged to update the secondary factor vector at a rate of at most 10% of the sample data rate of the input signal.

13. A system according to claim 9, wherein the processor is arranged to update the secondary factor vector by adding, to the previous value of the secondary factor vector, the product of a (i) weighting factor vector and (ii) the residual of the measured output signal power and an estimate of the signal power derived from the measurement vector and the previous value of the secondary factor vector.

14. A system according to claim 13, wherein the weighting factor vector minimises the least squares error in the secondary factor vector.

15. A system according to claim 2, further comprising a memory storing initial values for the at least one predetermined factor.

16. A system according to claim 2, wherein said at least one pre-distortion factor includes at least one factor to pre-distort to allow for harmonic distortion.

* * * * *